United States Patent
Kuo

(10) Patent No.: US 9,812,064 B2
(45) Date of Patent: Nov. 7, 2017

(54) ORGANIC LIGHT-EMITTING DISPLAY PANEL AND METHOD FOR COMPENSATING VOLTAGE DROP THEREOF

(71) Applicant: Shenzhen China Star Optoelectronics Technology Co., Ltd., Shenzhen, Guangdong (CN)

(72) Inventor: Ping Sheng Kuo, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/778,104

(22) PCT Filed: Jan. 29, 2015

(86) PCT No.: PCT/CN2015/071842
§ 371 (c)(1),
(2) Date: Nov. 21, 2016

(87) PCT Pub. No.: WO2016/115752
PCT Pub. Date: Jul. 28, 2016

(65) Prior Publication Data
US 2017/0162124 A1  Jun. 8, 2017

(30) Foreign Application Priority Data
Jan. 19, 2015 (CN) .......................... 2015 1 0025858

(51) Int. Cl.
G09G 3/30 (2006.01)
G09G 3/3283 (2016.01)
H01L 27/32 (2006.01)

(52) U.S. Cl.
CPC .......... *G09G 3/3283* (2013.01); *H01L 27/32* (2013.01); *G09G 2320/0233* (2013.01)

(58) Field of Classification Search
CPC .. G09G 3/3283; G09G 3/3208; G09G 3/3258; G09G 3/3291; G09G 2320/0233
See application file for complete search history.

(56) References Cited

U.S. PATENT DOCUMENTS

| 6,177,914 B1 * | 1/2001 | Iwama ................. G09G 3/2011 345/60 |
| 6,847,172 B2 * | 1/2005 | Suzuki ................. G09G 3/3233 315/169.3 |

(Continued)

FOREIGN PATENT DOCUMENTS

| CN | 1556977 | 12/2004 |
| CN | 103268756 | 8/2013 |

(Continued)

OTHER PUBLICATIONS

Search Report and Written Opinion, dated Jan. 19, 2015, in international application No. PCT/CN2015/071842.

(Continued)

*Primary Examiner* — Vijay Shankar
(74) *Attorney, Agent, or Firm* — Kim Winston LLP

(57) ABSTRACT

Disclosed is an organic light-emitting display panel and a method for compensating voltage drop thereof. The organic light-emitting display panel is added with a voltage drop compensation unit, which is connected to a data driving unit, and used for calculating, as per a data voltage output by the data driving unit and inbuilt iterative algorithm, a voltage at a junction between a power wiring and each of a plurality of pixel units. Subsequently, the data voltage output by the data driving unit is compensated based on a voltage difference between the voltage as calculated and a supply voltage.

19 Claims, 6 Drawing Sheets

(56) References Cited

U.S. PATENT DOCUMENTS

| | | | |
|---|---|---|---|
| 7,030,842 B2* | 4/2006 | Ha | G09G 3/2011 345/76 |
| 8,111,216 B2* | 2/2012 | Chan | G09G 3/3233 345/76 |
| 2012/0236041 A1 | 9/2012 | Oh | |
| 2012/0249514 A1 | 10/2012 | Ahn | |

FOREIGN PATENT DOCUMENTS

| | | |
|---|---|---|
| CN | 103996374 | 8/2014 |
| KR | 100923347 | 10/2009 |

OTHER PUBLICATIONS

Office Action and Search Report, dated Feb. 3, 2017, for Chinese Patent Application No. 201510025858.8.

* cited by examiner

ORGANIC LIGHT-EMITTING DISPLAY PANEL AND METHOD FOR COMPENSATING VOLTAGE DROP THEREOF

The present application claims benefit of Chinese patent application CN 201510025858.8, entitled "Organic light-emitting display panel and method for compensating voltage drop thereof" and filed on Jan. 19, 2015, the entirety of which is incorporated herein by reference.

FIELD OF THE INVENTION

The present disclosure relates to display panel technologies, and in particular, to an organic light-emitting display panel and a method for compensating voltage drop thereof.

BACKGROUND OF THE INVENTION

In recent years, organic light-emitting display panels, due to the advantages thereof such as ultra-thinness and lightness, self-illumination, low power consumption, high efficiency, high contrast, and fast response, have become the most popular products in the market following thin film transistor liquid crystal display panels.

FIG. 1 schematically shows one organic light-emitting display panel and pixel units thereof in the prior art. Typically, an organic light-emitting display panel outputs pictures through progressive scanning. That is, scanning signals are transmitted to activate switch transistors (marked as T1 in the figure) in the pixel units line by line, so as to enable drive transistors (marked as T2 in the figure) in the pixel units to receive data voltages characterizing image information. Under co-action of a data voltage and a supply voltage, the drive transistor is activated and generates a corresponding drive current, which is supplied to an organic light-emitting diode (marked as OLED in the figure) and drives the organic light-emitting diode to work. The brightness of the organic light-emitting diode is dependent on a current $I_{OLED}$ flowing therethrough, and the current $I_{OLED}$ equals a drain-source current $I_{ds}$ (also referred to as a drive current) of the drive transistor T2. With regard to the drive transistor T2, the drive current can be determined through the following formula:

$$I_{ds} = K \cdot (V_{gs} - V_{th})^2$$

$$= K \cdot (OV_{dd} - V_{data} - |V_{th}|)^2,$$

wherein K represents an electrical parameter of the drive transistor, and $V_{gs}$, $V_{th}$, $OV_{dd}$, and $V_{data}$ respectively indicate gate-source voltage of the drive transistor, threshold voltage of the drive transistor, supply voltage, and data voltage.

It is indicated in the above formula, the drive current is closely related to the supply voltage, the data voltage, and the electrical parameter (such as channel dimension and threshold voltage) of the drive transistor.

Theoretically, all the pixel units located on one and a same display panel will use one type of drive transistors, and operate under a same voltage source. Therefore, when the pixel units are each input with a same data voltage, all the pixel units will have the same drive current flowing through respective organic light-emitting diodes, thereby enabling identity in time and homogeneity in space with respect to brightness of the organic light-emitting diodes in all the pixel units. However, this is not actually the case. Influenced by various factors such as technological conditions, particularly voltage division by resistance of a power wiring per se, drive currents flowing through the light-emitting diodes of all the pixel units will be different from one another, thereby causing brightness distortion and inhomogeneous brightness of the pixel units on the display panel. In particular, as the display technology develops in recent years, display panels are increasingly larger-sized. Accordingly, the power wiring supplying power to the pixel units is becoming longer. This deteriorates the problem of inhomogeneous brightness of the display panel, and becomes an urgent problem to be solved in the field.

SUMMARY OF THE INVENTION

Directed against the above problems, the present disclosure proposes a new method for compensating a voltage drop of an organic light-emitting display panel, so as to eliminate inhomogeneous brightness thereof, and an organic light-emitting display panel using the method.

The method for compensating a voltage drop comprises:

step S100: calculating, based on a data voltage $V_{data,i}$ output by a data driving unit to each of a plurality of pixel units, a drive current $I_{ds,i}$ flowing through each of the pixel units via the following formula, under the assumption that a voltage $OV_{dd,i}$ at a junction between a power wiring and each of the pixel units located along the power wiring is equal to a supply voltage $OV_{dd}$:

$$I_{ds,i} = K \cdot (OV_{dd,i} - V_{data,i} - |V_{th}|^2)$$

$$OV_{dd,1} = OV_{dd,2} = \ldots = OV_{dd,i} = OV_{dd},$$

wherein i=1, 2, . . . , n, $V_{th}$ represents a threshold voltage of a drive transistor in the pixel unit; K is an electrical parameter of the drive transistor in the pixel unit; and n indicates the number of the pixel units located along the power wiring;

step S200: substituting the drive current $I_{ds,i}$ flowing through each of the pixel units into the following formula, to calculate the voltage $OV_{dd,i}$ at the junction between a corresponding pixel unit and the power wiring:

$$OV_{dd,i} = OV_{dd,i-1} - (\Sigma_{i=n,i=i-1}{}^{i} I_{ds,i}) \cdot R,$$

wherein i=1, 2, . . . , n, R represents a parasitic resistance of a section of the power wiring between two adjacent pixel units;

step S300: judging whether a result obtained in step S200 satisfies prescribed requirements, and entering step S400, if yes, or entering step S500, if no;

step S400: calculating the drive current $I_{ds,i}$ flowing through each of the pixel units via the following formula, according to the data voltage $V_{data,i}$ output by the data driving unit to a corresponding pixel unit, and the voltage $OV_{dd,i}$ at the junction between the corresponding pixel unit and the power wiring, as obtained in step S200:

$$I_{ds,i} = K \cdot (OV_{dd,i} - V_{data,i} - |V_{th}|^2),$$

wherein i=1, 2, . . . , n, and returning to step S200;

step S500: calculating a voltage difference between the supply voltage and the voltage at the junction between each of the pixel units and the power wiring as obtained in step S200; and step S600: compensating the data voltage output by the data driving unit to each of the pixel units according to the voltage difference, and supplying a compensated data voltage to a corresponding pixel unit.

According to one embodiment of the present disclosure, in step S300, it is judged whether step S200 is executed less than a threshold value of times, followed by entry of step S400 if yes, or entry of step S500 if no.

According to another embodiment of the present disclosure, in step S300, it is judged whether the following formula produces a result smaller than a threshold value, followed by entry of step S400 if yes, or entry of step S500 if no:

$$\frac{(OV_{dd,i})_k - (OV_{dd,i})_{k-1}}{(OV_{dd,i})_{k-1}} \times 100\%,$$

wherein $(OV_{dd,i})_k$ represents the voltage at the junction between a corresponding pixel unit and the power wiring when step S200 is executed for a $k^{th}$ time.

In addition, the threshold value in step S300 can be configured or modified according to an adjustment result of brightness.

According to one embodiment of the present disclosure, in step S600, a corresponding compensation voltage can be calculated as per the voltage difference and a prescribed functional relationship, superposed with the data voltage, and then supplied to a corresponding pixel unit.

Further, in step S600, the compensation voltage equals an original data voltage plus the voltage difference.

According to another embodiment of the present disclosure, in step S600, corresponding voltage data can be looked up in a prescribed relation table as per the voltage difference, and the data voltage output by the data driving unit can be converted into the voltage data, which are supplied to a corresponding pixel unit.

In addition, the present disclosure further provides an organic light-emitting display panel, comprising:

a plurality of pixel units;

a power supply unit, which provides a supply voltage to each of the pixel units via a power wiring;

a scan driving unit, which outputs a scanning signal to each of the pixel units via a scan line;

a data driving unit, which outputs a data voltage to each of the pixel units via a data line; and a voltage drop compensation unit, which is connected to the data driving unit and used for calculating a voltage at a junction between each of the pixel units and the power wiring based on the data voltage output by the data driving unit to each of the pixel units, compensating the data voltage output by the data driving unit to each of the pixel units based on a voltage difference between the voltage as calculated and the supply voltage, and supplying a compensated data voltage to each of the pixel units.

According to an embodiment of the present disclosure, the voltage drop compensation unit, through iterative algorithm, calculates the voltage at the junction between each of the pixel units and the power wiring, the iterative algorithm comprising:

step S100: calculating, based on a data voltage $V_{data,i}$ output by the data driving unit to each of the plurality of pixel units, a drive current $I_{ds,i}$ flowing through each of the pixel units via the following formula, under the assumption that a voltage $OV_{dd,i}$ at a junction between the power wiring and each of the pixel units located along the power wiring is equal to a supply voltage $OV_{dd}$:

$$I_{ds,i} = K \cdot (OV_{dd,i} - V_{data,i} - |V_{th}|^2)$$

$$OV_{dd,1} = OV_{dd,2} = \ldots = OV_{dd,i} = OV_{dd},$$

wherein $i=1, 2, \ldots, n$, $V_{th}$ represents a threshold voltage of a drive transistor in the pixel unit; K is an electrical parameter of the drive transistor in the pixel unit; and n indicates the number of the pixel units located along the power wiring;

step S200: substituting the drive current $I_{ds,i}$ flowing through each of the pixel units into the following formula, to calculate the voltage $OV_{dd,i}$ at the junction between a corresponding pixel unit and the power wiring:

$$OV_{dd,i} = OV_{dd,i-1} - (\Sigma_{i=n,i=i-1}{}^i I_{ds,i}) \cdot R,$$

wherein $i=1, 2, \ldots, n$, R represents a parasitic resistance of a section of the power wiring between two adjacent pixel units;

step S300: judging whether a result obtained in step S200 satisfies prescribed requirements, and entering step S400, if yes, or entering step S500, if no;

step S400: calculating the drive current $I_{ds,i}$ flowing through each of the pixel units via the following formula, according to the data voltage $V_{data,i}$ output by the data driving unit to a corresponding pixel unit, and the voltage $OV_{dd,i}$ at the junction between the corresponding pixel unit and the power wiring, as obtained in step S200:

$$I_{ds,i} = K \cdot (OV_{dd,i} - V_{data,i} - |V_{th}|^2),$$

wherein $i=1, 2, \ldots, n$, and returning to step S200; and step S500: calculating a voltage difference between the supply voltage and the voltage at the junction between each of the pixel units and the power wiring as obtained in step S200.

Specifically, according to the embodiments of the present disclosure, in step S300, it is judged whether the following formula produces a result smaller than a threshold value, followed by entry of step S400 if yes, or entry of step S500 if no:

$$\frac{(OV_{dd,i})_k - (OV_{dd,i})_{k-1}}{(OV_{dd,i})_{k-1}} \times 100\%,$$

wherein $(OV_{dd,i})_k$ represents the voltage at the junction between a corresponding pixel unit and the power wiring when step S200 is executed for a $k^{th}$ time.

According to the embodiments of the present disclosure, the compensation voltage can equal an original data voltage plus the voltage difference.

Compared with the prior art, one or more embodiments of the present disclosure has the following advantages.

In the present disclosure, a nonlinear mathematical model is used to simulate voltage drop in the organic light-emitting diode display panel, and iterative algorithm is used to solve the nonlinear mathematical model, so as to estimate the voltage drop of the panel, and thus to perform real-time compensation on the data voltage based on an estimation result. The phenomenon of inhomogeneous brightness in the panel can be effectively eliminated through the method of the present disclosure.

Through simulation, it has been verified that, with the method for compensating voltage drop of the present disclosure, an accuracy higher than 99% can be reached in estimation of voltage drop in the panel, and a compensated panel thereby can have homogeneity increased by 26.7% approximately, thereby effectively solving the technical problem of inhomogeneous brightness in the display panel due to voltage drop in the prior art.

BRIEF DESCRIPTION OF THE DRAWINGS

The drawings are provided for further understanding of the present disclosure, and constitute one part of the description. They serve to explain the present disclosure in junction with the embodiments, rather than to limit the present disclosure in any manner. In the drawings.

DETAILED DESCRIPTION OF THE EMBODIMENTS

The technical solution of the present disclosure will be explained in detail with reference to the embodiments and the accompanying drawings, whereby the above purposes, features, and advantages of the present disclosure can be more readily understood. It is important to note that various specific details are expounded in the following to provide a thorough understanding of the present disclosure. However, the present disclosure can be implemented through other specific manners than those described herein. The present disclosure will therefore not be limited to the following specific embodiments.

Embodiment One

Figure 1:
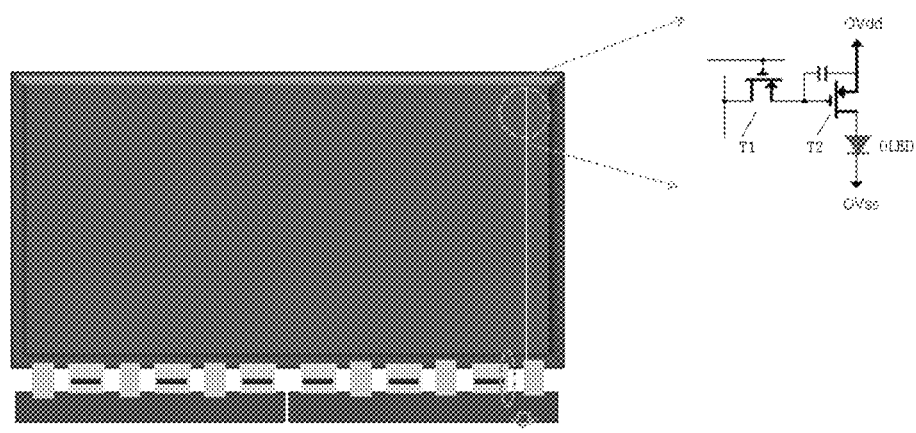
FIG. 1 schematically shows one organic light-emitting display panel and pixel units thereof in the prior art.
Figure 2:
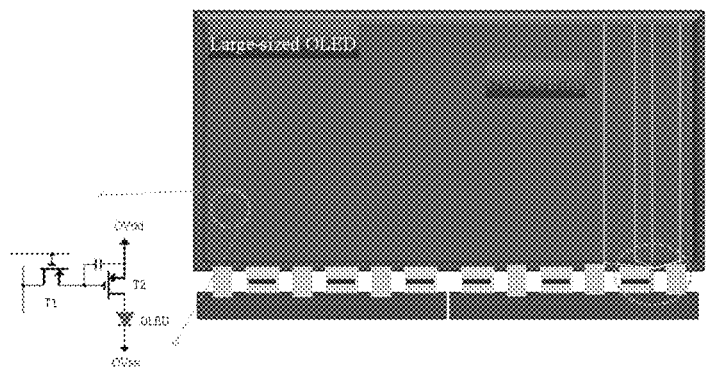
FIG. 2 schematically shows a one-dimensional large-sized organic light-emitting display panel provided in Embodiment One of the present disclosure.

FIG. 2 schematically shows a one-dimensional large-sized organic light-emitting display panel provided in Embodiment One of the present disclosure. Like a thin film transistor liquid crystal display panel, the organic light-emitting display panel is provided with M×N pixel units arranged in a matrix. N pixel units located in one and a same row are electrically connected to one and a same scan line, for receiving a scanning signal from a scan driving unit. For instance, pixel units (i, 1), (i, 2), . . . , (i, N) located in an $i^{th}$ row are electrically connected to an $i^{th}$ scan line Gate_i. And M pixel units located at one and a same column are electrically connected to one and a same data line, for receiving a data voltage from a data driving unit. For instance, pixel units (1, j), (2, j), . . . , (M, j) located at a $j^{th}$ column are electrically connected to a $j^{th}$ data line Data_j. Meanwhile, each of the pixel units is further electrically connected, via a power wiring I, to a power supply unit, for receiving a supply voltage (indicated by $OV_{dd}$ in the figures). In the one-dimensional display panel as shown in FIG. 2, each column of pixel units are configured with one power wiring I parallel with the data lines. The present disclosure is, of course, not limited thereto.

Figure 3:
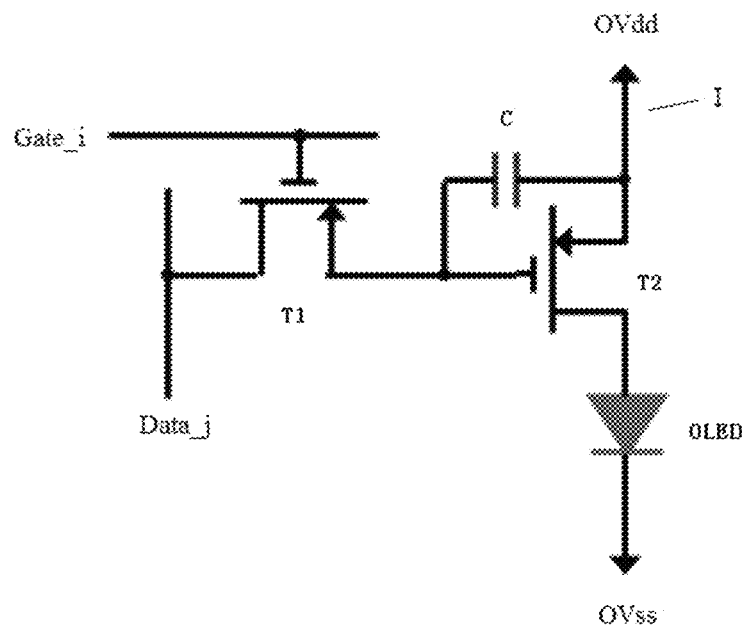
FIG. 3 shows a circuit diagram of a pixel unit located in the panel as shown in FIG. 2.

FIG. 3 shows a circuit diagram of a pixel unit located in the panel as shown in FIG. 2. As indicated in FIG. 3, the pixel unit forms a commonly used 2T1C structure, which comprises a switch transistor T1, a drive transistor T2, an organic light-emitting diode OLED, and a charging capacitor C. In connection with the pixel unit located in the $i^{th}$ row and at the $j^{th}$ column, for example, the switch transistor T1 has a control terminal connected to the corresponding scan line Gate_i, a first terminal connected to the corresponding data line Data_j, and a second terminal connected to a control terminal of the drive transistor T2; the drive transistor T2 has a first terminal connected to the power wiring I, and a second terminal connected to a positive electrode of the organic light-emitting diode OLED; the organic light-emitting diode OLED has a negative electrode electrically grounded (indicated by $OV_{ss}$ in the figure); and the charging capacitor has a first electrode and a second electrode respectively connected to the control terminal and the first terminal of the drive transistor T2, so as to maintain a voltage difference therebetween. When the scan line Gate_i receives a scanning signal, the switch transistor T1 is activated, such that a data voltage of the data line Data_j will be transmitted to the control terminal of the drive transistor T2. Because there is a voltage difference between the control terminal and the first terminal of the drive transistor T2 (theoretically being equal to a difference between the data voltage and the supply voltage), the drive transistor T2 will be activated, to output a corresponding drive current $I_{ds}$, which will flow through the organic light-emitting diode OLED and drive it to emit light. Brightness of the organic light-emitting diode OLED is in direction proportion to the size of the drive current. With respect to the drive transistor T2, the drive current $I_{ds}$ can be calculated through the following formula:

$$I_{ds} = K \cdot (V_{gs} - V_{th})^2$$
$$= K \cdot (OV_{dd} - V_{data} - |V_{th}|)^2,$$

wherein K is an electrical parameter of the drive transistor, and $V_{gs}$, $V_{th}$, $OV_{dd}$, and $V_{data}$ respectively indicate voltage difference between the control terminal and the first terminal of the drive transistor, threshold voltage of the drive transistor, supply voltage, and data voltage.

As introduced above in the Background of the Invention, in practice, there will be a certain voltage drop on the power wiring I, which has a parasitic resistance, when a drive current flows therethrough. This renders a voltage actually obtained by each of the pixel units unequal to the supply voltage $OV_{dd}$. To be distinguished from the supply voltage $OV_{dd}$, the actual voltage at a junction between each of the pixel units and the power wiring I, i.e., the first terminal of the drive transistor of the pixel unit, will be indicated as $OV_{dd,i}$ in the following.

Figure 4:
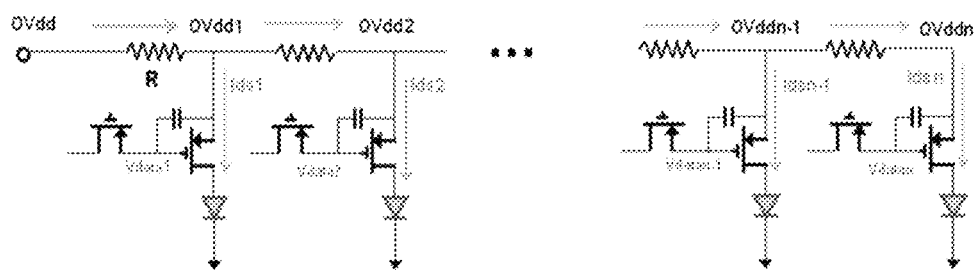
FIG. 4 shows an equivalent circuit diagram of pixel units located at one and a same column and connected to one and a same power wiring on the panel as shown in FIG. 2.

FIG. 4 shows an equivalent circuit diagram of pixel units (1, j), (2, j), . . . , (M, j) that are located at column j and connected to one and the same power wiring I. As indicated in FIG. 4, the voltages at junctions between the pixel units and the power wiring I are $OV_{dd,1}$, $OV_{dd,2}$, . . . , $OV_{dd,n-1}$, and $OV_{dd,n}$, respectively; the data voltages received by the control terminals of the drive transistors of the pixel units are $V_{data,1}$, $V_{data,2}$, . . . , $V_{data,n-1}$, and $V_{data,n}$, respectively; and the drive currents flowing from the pixel units to the organic light-emitting diodes through the drive transistors are $I_{ds,1}$, $I_{ds,2}$, . . . , $I_{ds,n-1}$, and $I_{ds,n}$, respectively. In addition, the parasitic resistance of a section of the power wiring I between two adjacent pixel units is R.

With respect to the pixel unit (n, j), there exist the following relations:

$$\begin{cases} OV_{dd,n} = OV_{dd,n-1} - I_{ds,n} \cdot R \\ I_{ds,n} = K \cdot (OV_{dd,n} - V_{data,n} - |Vth|^2) \end{cases}$$

In view of the above, the following formulae can be obtained through recursion:

$$\begin{cases} OV_{dd,n-1} = OV_{dd,n-2} - (I_{ds,n} + I_{ds,n-1}) \cdot R \\ \vdots \\ OV_{dd,1} = OV_{dd} - (I_{ds,n} + \ldots + I_{ds,1}) \cdot R \end{cases}$$

Therefore, in connection with the pixel unit (n, j), there exist the following relations:

$$OV_{dd,i} = OV_{dd,i-1} - (\Sigma_{i=n,i=i-1}{}^{i} I_{ds,i}) \cdot R \quad (1)$$

$$I_{ds,i} = K \cdot (OV_{dd,i} - V_{data,i} - \star V_{th}|^2) \quad (2)$$

wherein i=1, 2, ..., n.

Formula (1) shows that the voltage at the junction between each of the pixel units and the power wiring I is determined by the drive current flowing from the pixel unit to the organic light-emitting diode through the drive transistor. Further, it can be seen from formula (2), the voltage at the junction between each of the pixel units and the power wiring I is determined by the data voltage received at the control terminal of the drive transistor in the pixel unit.

Figure 5:
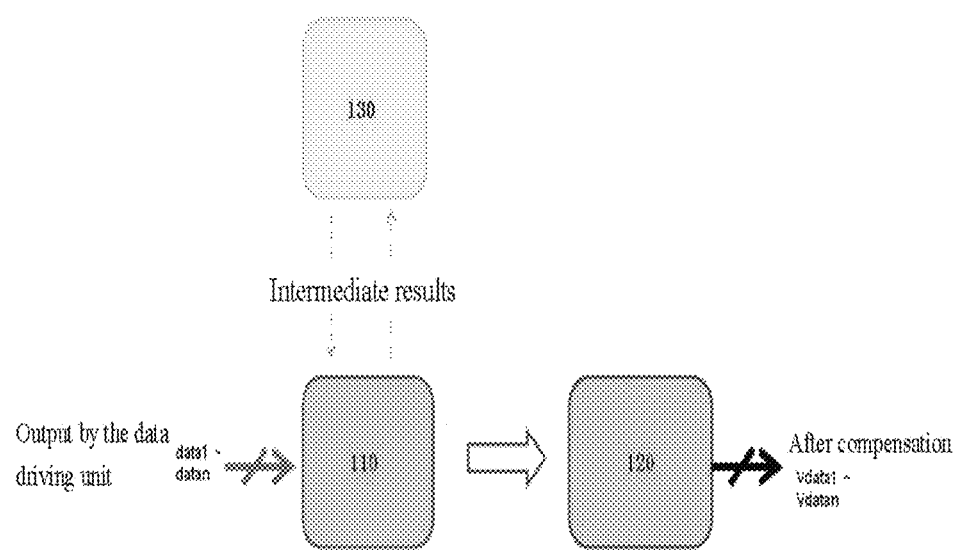
FIG. 5 schematically shows modules of a voltage drop compensation unit provided in Embodiment One of the present disclosure.

In this connection, the inventor of the present disclosure proposes to add a voltage drop compensation unit in the conventional organic light-emitting display panel, for compensating voltage drop caused by resistance of the power wiring per se, so as to eliminate the phenomenon of inhomogeneous brightness of the display panel. As shown in FIG. 5, the voltage drop compensation unit can comprise a plurality of functional modules.

Among these functional modules, an iterative calculation module 110 is connected to the data driving unit of the display panel, and used for calculating, based on the data voltage output from the data driving unit and through iterative calculation, the voltage at the junction between each of the pixel units and the power wiring I.

And a voltage compensation module 120 is connected to the iterative calculation module 110, and used for performing, according to a difference between the voltage provided by the iterative calculation module 110 and the supply voltage, voltage compensation on the data voltage output from the data driving unit, and providing a compensated data voltage to a corresponding pixel unit.

Of course, the above voltage drop compensation unit can further comprise a data storage module 130, which is connected to the iterative calculation module 110, and used for storing intermediate results calculated by the iterative calculation module 110, such as $I_{ds,1}, I_{ds,2}, \ldots, I_{ds,n-1}$, and $I_{ds,n}$.

Figure 6:
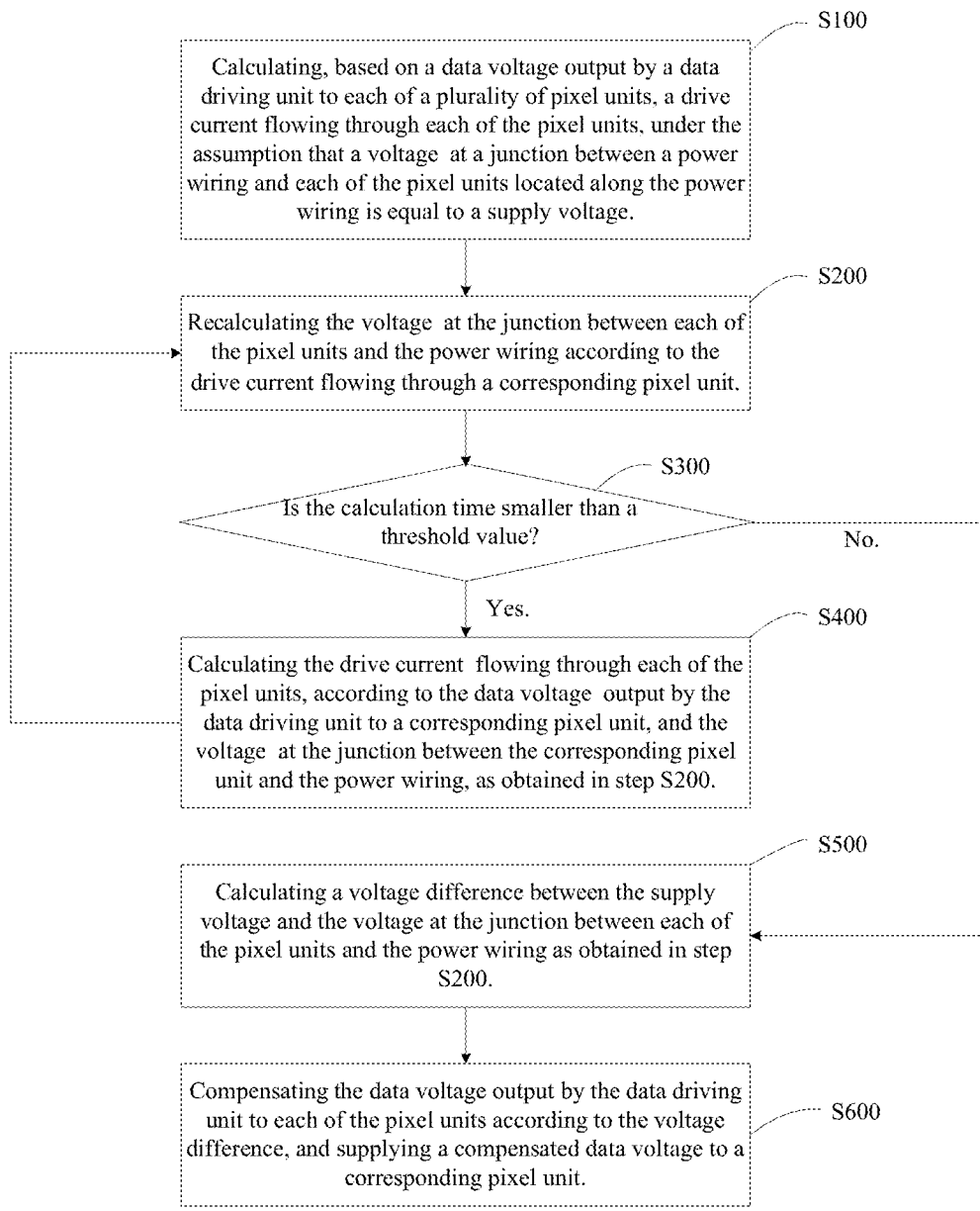
FIG. 6 shows an operating flow chart of a method for compensating a voltage drop as provided in Embodiment One of the present disclosure.

As shown in FIG. 6, the organic light-emitting display panel provided with the above voltage drop compensation unit can execute voltage drop compensation through the following operational steps.

In step S100, under the assumption that the voltage $OV_{dd,i}$ at the junction between the power wiring and each of the pixel units located along the power wiring is equal to the supply voltage $OV_{dd}$, and based on the data voltage $V_{data,i}$ output by the data driving unit to each of the pixel units, the drive current $I_{ds,i}$ flowing through each of the pixel units is calculated via the following formula:

$$I_{ds,i} = K \cdot (OV_{dd,i} - V_{data,i} - |V_{th}|^2)$$

$$OV_{dd,1} = OV_{dd,2} = \ldots = OV_{dd,i} = OV_{dd},$$

wherein i=1, 2, ..., n, K is an electrical parameter of the drive transistor in the pixel unit, and $V_{th}$ represents a threshold voltage of the drive transistor in the pixel unit.

In step S200, the drive current $I_{ds,i}$ flowing through each of the pixel units is substituted into the following formula, to calculate the voltage $OV_{dd,i}$ at the junction between a corresponding pixel unit and the power wiring:

$$OV_{dd,i} = OV_{dd,i-1} - (\Sigma_{i=n,i=i-1}{}^{i} I_{ds,i}) \cdot R,$$

wherein i=1, 2, ..., n, R represents a parasitic resistance of a section of the power wiring I between two adjacent pixel units.

In step S300, it is judged whether step S200 is executed less than a prescribed threshold number of times, and step S400 is executed, if yes, or step S500 is executed, if no.

In step S400, the drive current $I_{ds,i}$ flowing through each of the pixel units is calculated via the following formula, according to the data voltage $V_{data,i}$ output by the data driving unit to a corresponding pixel unit, and the voltage $OV_{dd,i}$ at the junction between the corresponding pixel unit and the power wiring, as obtained in step S200: $I_{ds,i} = K \cdot (OV_{dd,i} - V_{data,i} - |V_{th}|^2)$, wherein i=1, 2, ..., n, and step S200 is returned to.

In step S500, a voltage difference $\Delta OV_{dd,i}$ between the supply voltage $OV_{dd}$ and the voltage $OV_{dd,i}$ at the junction between each of the pixel units and the power wiring as obtained in step S200 is calculated.

In step S600, the data voltage output by the data driving unit to each of the pixel units is compensated according to the voltage difference $\Delta OV_{dd,i}$, and a compensated data voltage is supplied to a corresponding pixel unit.

In specific execution of step S300, the threshold number of times can be altered according to an adjustment result of brightness.

In specific execution of step S600, a corresponding compensation voltage can be calculated as per the voltage difference and a prescribed functional relationship, and the compensation voltage and the data voltage can be superposed and then supplied to the corresponding pixel unit. Alternatively, corresponding voltage data can be looked up in a prescribed relation table as per the voltage difference, and the data voltage output by the data driving unit can be converted into the voltage data, which are then supplied to the corresponding pixel unit.

With respect to the former, a simplest functional relationship is to let the compensation voltage equal the original data voltage plus the voltage difference. That is, the data voltage can be reduced at the same amount as the voltage drops (for p-type drive transistors), so as to retain the voltage between the control terminal and the first terminal of the drive transistor of each of the pixel units unchanged, thereby enabling homogeneous brightness of the display panel to the farthest extent.

Embodiment Two

In Embodiment One, it is judged whether to continue performance of iterative calculation according to whether the number of times for execution of step S200 satisfies prescribed requirements. The present disclosure is, of course, far from being limited thereto in practice. For example, it can be judged whether to continue performance of iterative calculation according to whether the voltage $OV_{dd,i}$ at the junction between the power wiring and each of the pixel units satisfies prescribed requirements also.

Figure 7:
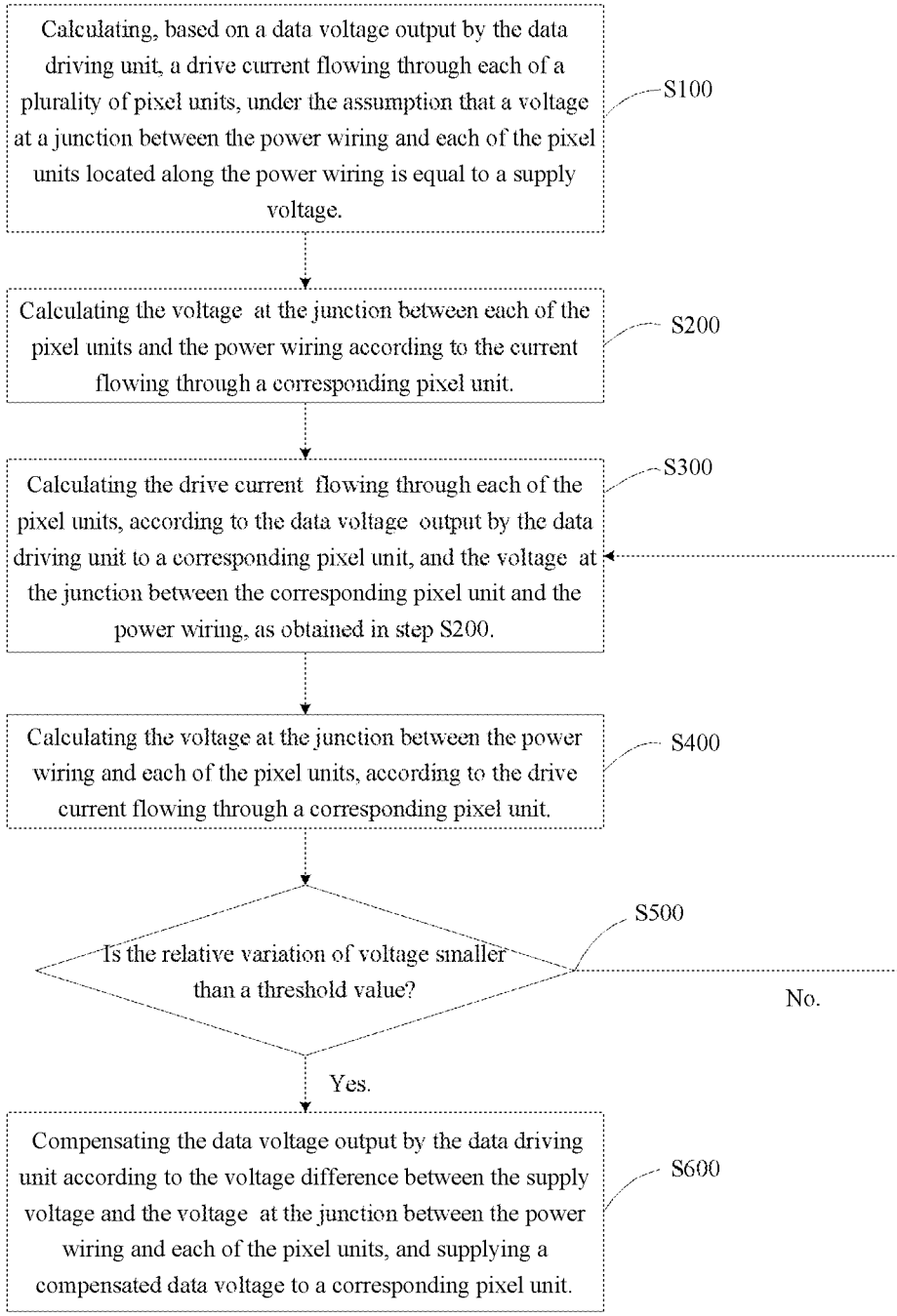
FIG. 7 shows an operating flow chart of a method for compensating a voltage drop as provided in Embodiment Two of the present disclosure.

FIG. 7 shows an operating flow chart of a method for compensating a voltage drop in a panel as provided in Embodiment Two of the present disclosure.

In step S100, under the assumption that a voltage $OV_{dd,i}$ at a junction between the power wiring and each of a plurality of pixel units located along the power wiring is equal to a supply voltage $OV_{dd}$, and based on a data voltage $V_{data,i}$ output by a data driving unit to each of the pixel units, a drive current $I_{ds,i}$ flowing through each of the pixel units is calculated via the following formula:

$$I_{ds,i}=K\cdot(OV_{dd,i}-V_{data,i}-|V_{th}|^2)$$

$$OV_{dd,1}=OV_{dd,2}=\ldots=OV_{dd,i}=OV_{dd},$$

wherein i=1, 2, . . . , n, K is an electrical parameter of the drive transistor in the pixel unit, and $V_{th}$ represents a threshold voltage of the drive transistor in the pixel unit.

In step S200, the drive current $I_{ds,i}$ flowing through each of the pixel units is substituted into the following formula, to calculate the voltage $OV_{dd,i}$ at the junction between a corresponding pixel unit and the power wiring:

$$OV_{dd,i}=OV_{dd,i-1}-(\Sigma_{i=n,i=i-1}{}^{i}I_{ds,i})\cdot R,$$

wherein i=1, 2, . . . , n, R represents a parasitic resistance of a section of the power wiring I between two adjacent pixel units.

In step S300, the drive current $I_{ds,i}$ flowing through each of the pixel units is calculated via the following formula, according to the data voltage $V_{data,i}$ output by the data driving unit to a corresponding pixel unit, and the voltage $OV_{dd,i}$ at the junction between the corresponding pixel unit and the power wiring, as obtained in step S200, $$I_{ds,i}=K\cdot(OV_{dd,i}-V_{data,i}-|V_{th}|^2),$$

wherein i=1, 2, . . . , n.

In step S400, the drive current $I_{ds,i}$ flowing through each of the pixel units is substituted into the following formula, to calculate the voltage $OV_{dd,i}$ at the junction between a corresponding pixel unit and the power wiring:

$$OV_{dd,i}=OV_{dd,i-1}-(\Sigma_{i=n,i=i-1}{}^{i}I_{ds,i})\cdot R,$$

wherein i=1, 2, . . . , n, R represents a parasitic resistance of a section of the power wiring I between two adjacent pixel units.

In step S500, it is judged, according to the voltage $V_{data,i}$ at the junction between the power wiring and each of the pixel units as obtained in step S300, whether the following formula produces a result smaller than a threshold value, followed by entry of step S600 if yes, or return to step S300 for further iterative calculations, if no:

$$\frac{(OV_{dd,i})_k - (OV_{dd,i})_{k-1}}{(OV_{dd,i})_{k-1}} \times 100\%,$$

wherein $(OV_{dd,i})_k$ represents the voltage at the junction between a corresponding pixel unit and the power wiring when step S200 is executed for a $k^{th}$ time.

This step is to examine whether the voltage at the junction between the power wiring and each of the pixel units varies as per prescribed requirements in a last execution of step S200 as compared with a previous execution of step S200.

In step S600, the data voltage output by the data driving unit to each of the pixel units is compensated according to the voltage difference $\Delta OV_{dd,i}$ between the supply voltage $OV_{dd}$ and the voltage $OV_{dd,i}$ at the junction between the power wiring and a corresponding pixel unit as obtained in step S200, and a compensated data voltage is supplied to the corresponding pixel unit.

In specific execution of step S500, the threshold value can be altered according to an adjustment result of brightness.

The above two embodiments indicate that, the step for judging whether to continue performance of iterative calculations can be flexibly specified. Therefore, the method of the present disclosure should not be confined to any specific sequences in procedure execution. All technical solutions that can be used to achieve the purpose of the present disclosure fall within the scope of the present disclosure.

Figure 8:
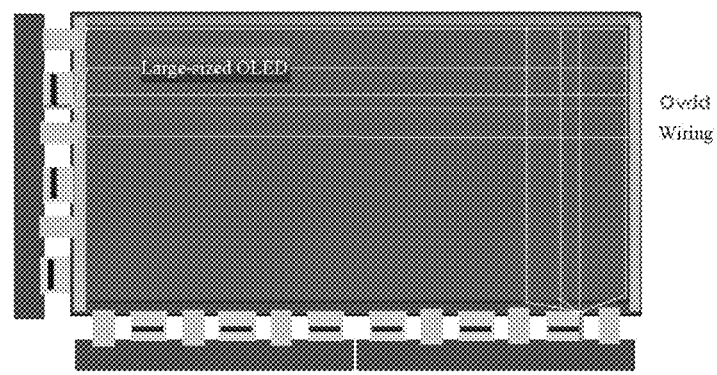
FIG. 8 schematically shows a two-dimensional large-sized organic light-emitting display panel provided in Embodiment Two of the present disclosure.

It should be noted that, organic light-emitting display panels using the above method for voltage drop compensation can also be two-dimensional display panels. FIG. 8 schematically shows a two-dimensional large-sized organic light-emitting display panel provided in the present disclosure. In a two-dimensional display panel, each row/column of pixel units is configured with one power wiring I parallel with the scan lines/data lines. In this connection, the inventor of the present disclosure proposes employment of two voltage drop compensation units for respective calculations of two sets of voltage differences, and for respective compensation operations in an x-direction and a y-direction. That is, when calculation is performed for compensation in the x-direction based on $OV_{dd}$ in the x-direction, $OV_{dd}$ in the y-direction will be deemed as GND. On the contrary, when calculation is performed for compensation in the y-direction based on $OV_{dd}$ in the y-direction, $OV_{dd}$ in the x-direction will be deemed as GND. Superposition of the calculation results for compensation in the two directions will be finally performed.

The above embodiments are described only for better understanding, rather than restricting, the present disclosure. For example, the structure of the pixel unit is not limited to 2T1C. Any person skilled in the art can make amendments to the implementing forms or details without departing from the spirit and scope of the present disclosure. The scope of the present disclosure should still be subject to the scope defined in the claims.

The invention claimed is:

1. An organic light-emitting display panel, comprising:
a plurality of pixel units;
a power supply unit, which provides a supply voltage to each of the pixel units via a power wiring;
a scan driving unit, which outputs a scanning signal to each of the pixel units via a scan line;
a data driving unit, which outputs a data voltage to each of the pixel units via a data line; and
a voltage drop compensation unit, which is connected to the data driving unit and used for calculating a voltage at a junction between each of the pixel units and the power wiring based on the data voltage output by the data driving unit to each of the pixel units, compensating the data voltage output by the data driving unit to each of the pixel units based on a voltage difference between the voltage as calculated and the supply voltage, and supplying a compensated data voltage to each of the pixel units; wherein the voltage drop compensation unit, through iterative algorithm, calculates the voltage at the junction between each of the pixel units and the power wiring, the iterative algorithm comprising:

step S100: calculating, based on a data voltage Vdata,i output by the data driving unit to each of the plurality of pixel units, a drive current Ids,i flowing through each of the pixel units via the following formula, under the assumption that a voltage OVdd,i at a junction between the power wiring and each of the pixel units located along the power wiring is equal to a supply voltage OVdd:

$$I_{ds,i} = K \cdot (OV_{dd,i} - V_{data,i} - |V_{th}|^2)$$

$$OV_{dd,1} = OV_{dd,2} = \ldots = OV_{dd,i} = OV_{dd},$$

wherein i=1, 2, . . . , n, Vth represents a threshold voltage of a drive transistor in the pixel unit; K is an electrical parameter of the drive transistor in the pixel unit; and n indicates the number of the pixel units located along the power wiring;

step S200: substituting the drive current Ids,i flowing through each of the pixel units into the following formula, to calculate the voltage at the junction between a corresponding pixel unit and the power wiring:

$$OV_{dd,i} = OV_{dd,i-1} - (\Sigma_{i=n,i=i-1}^{i} I_{ds,i}) \cdot R,$$

wherein i=1, 2, . . . , n, R represents a parasitic resistance of a section of the power wiring between two adjacent pixel units;

step S300: judging whether a result obtained in step S200 satisfies prescribed requirements, and entering step S400, if yes, or entering step S500, if no;

step S400: calculating the drive current flowing through each of the pixel units via the following formula, according to the data voltage output by the data driving unit to a corresponding pixel unit, and the voltage at the junction between the corresponding pixel unit and the power wiring, as obtained in step S200:

$$I_{ds,i} = K \cdot (OV_{dd,i} - V_{data,i} - |V_{th}|^2),$$

wherein i=1, 2 . . . n, and
returning to step S200; and step S500: calculating a voltage difference between the supply voltage and the voltage at the junction between each of the pixel units and the power wiring as obtained in step S200.

2. The organic light-emitting display panel of claim 1, wherein in step S300, it is judged whether the following formula produces a result smaller than a threshold value, followed by entry of step S400 if yes, or entry of step S500 if no:

$$\frac{(OV_{dd,i})_k - (OV_{dd,i})_{k-1}}{(OV_{dd,i})_{k-1}} \times 100\%,$$

wherein $(OV_{dd,i})_k$ represents the voltage at the junction between a corresponding pixel unit and the power wiring when step S200 is executed for a $k^{th}$ time.

3. The organic light-emitting display panel of claim 1, wherein in step S300, it is judged whether the following formula produces a result smaller than a threshold value, followed by entry of step S400 if yes, or entry of step S500 if no: (OV dd, i) k–(OV dd, i) k−1 (OV dd, i) k−1.times.100%, ##EQU00008## wherein (OV.sub.dd,i).sub.k represents the voltage at the junction between a corresponding pixel unit and the power wiring when step S200 is executed for a k.sup.th time.

4. The organic light-emitting display panel of claim 1, wherein the compensation voltage equals an original data voltage plus the voltage difference.

5. The organic light emitting display panel of claim 1, wherein the compensation voltage equals an original data voltage plus the voltage difference.

6. A method for compensating a voltage drop of an organic light-emitting display panel, comprising:

step S100: calculating, based on a data voltage $V_{data,i}$ output by a data driving unit to each of a plurality of pixel units, a drive current $I_{ds,i}$ flowing through each of the pixel units via the following formula, under the assumption that a voltage $OV_{dd,i}$ at a junction between a power wiring and each of the pixel units located along the power wiring is equal to a supply voltage $OV_{dd}$:

$$I_{ds,i} = K \cdot (OV_{dd,i} - V_{data,i} - |V_{th}|^2)$$

$$OV_{dd,1} = OV_{dd,2} = \ldots = OV_{dd,i} = OV_{dd},$$

wherein i=1, 2, . . . , n, $V_{th}$ represents a threshold voltage of a drive transistor in the pixel unit; K is an electrical parameter of the drive transistor in the pixel unit; and n indicates the number of the pixel units located along the power wiring;

step S200: substituting the drive current $I_{ds,i}$ flowing through each of the pixel units into the following formula, to calculate the voltage $OV_{dd,i}$ at the junction between a corresponding pixel unit and the power wiring:

$$OV_{dd,i} = OV_{dd,i-1} - (\Sigma_{i=n,i=i-1}^{i} I_{ds,i}) \cdot R,$$

wherein i=1, 2, . . . , n, R represents a parasitic resistance of a section of the power wiring between two adjacent pixel units;

step S300: judging whether a result obtained in step S200 satisfies prescribed requirements, and entering step S400, if yes, or entering step S500, if no;

step S400: calculating the drive current $I_{ds,i}$ flowing through each of the pixel units via the following formula, according to the data voltage $V_{data,i}$ output by the data driving unit to a corresponding pixel unit, and the voltage $OV_{dd,i}$ at the junction between the corresponding pixel unit and the power wiring, as obtained in step S200:

$$I_{ds,i} = K \cdot (OV_{dd,i} - V_{data,i} - |V_{th}|^2),$$

wherein i=1, 2, . . . , n, and
returning to step S200;

step S500: calculating a voltage difference between the supply voltage and the voltage at the junction between each of the pixel units and the power wiring as obtained in step S200; and step S600: compensating the data voltage output by the data driving unit to each of the pixel units according to the voltage difference, and supplying a compensated data voltage to a corresponding pixel unit.

7. The method for compensating a voltage drop of claim 6, wherein in step S300, it is judged whether step S200 is executed less than a threshold value of times, followed by entry of step S400 if yes, or entry of step S500 if no.

8. The method for compensating a voltage drop of claim 6, wherein in step S300, it is judged whether the following formula produces a result smaller than a threshold value, followed by entry of step S400 if yes, or entry of step S500 if no:

$$\frac{(OV_{dd,i})_k - (OV_{dd,i})_{k-1}}{(OV_{dd,i})_{k-1}} \times 100\%,$$

wherein $(OV_{dd,i})_k$ represents the voltage at the junction between a corresponding pixel unit and the power wiring when step S200 is executed for a $k^{th}$ time.

9. The method for compensating a voltage drop of claim 7, wherein the threshold value is configured or modified according to an adjustment result of brightness.

10. The method for compensating a voltage drop of claim 8, wherein the threshold value is configured or modified according to an adjustment result of brightness.

11. The method for compensating a voltage drop of claim 6, wherein in step S600, a corresponding compensation voltage is calculated as per the voltage difference and a prescribed functional relationship, superposed with the data voltage, and then supplied to a corresponding pixel unit.

12. The method for compensating a voltage drop of claim 7, wherein in step S600, a corresponding compensation voltage is calculated as per the voltage difference and a prescribed functional relationship, superposed with the data voltage, and then supplied to a corresponding pixel unit.

13. The method for compensating a voltage drop of claim 8, wherein in step S600, a corresponding compensation voltage is calculated as per the voltage difference and a prescribed functional relationship, superposed with the data voltage, and then supplied to a corresponding pixel unit.

14. The method for compensating a voltage drop of claim 11, wherein in step S600, the compensation voltage equals an original data voltage plus the voltage difference.

15. The method for compensating a voltage drop of claim 12, wherein in step S600, the compensation voltage equals an original data voltage plus the voltage difference.

16. The method for compensating a voltage drop of claim 13, wherein in step S600, the compensation voltage equals an original data voltage plus the voltage difference.

17. The method for compensating a voltage drop of claim 6, wherein in step S600, corresponding voltage data are looked up in a prescribed relation table as per the voltage difference, and the data voltage output by the data driving unit is converted into the voltage data, which are supplied to a corresponding pixel unit.

18. The method for compensating a voltage drop of claim 7, wherein in step S600, corresponding voltage data are looked up in a prescribed relation table as per the voltage difference, and the data voltage output by the data driving unit is converted into the voltage data, which are supplied to a corresponding pixel unit.

19. The method for compensating a voltage drop of claim 8, wherein in step S600, corresponding voltage data are looked up in a prescribed relation table as per the voltage difference, and the data voltage output by the data driving unit is converted into the voltage data, which are supplied to a corresponding pixel unit.

* * * * *